US012250861B2

(12) United States Patent
Wu

(10) Patent No.: US 12,250,861 B2
(45) Date of Patent: Mar. 11, 2025

(54) QUANTUM DOT PATTERN, QUANTUM DOT LIGHT-EMITTING DEVICE, DISPLAY APPARATUS, AND MANUFACTURING METHOD

(71) Applicant: BOE Technology Group Co., Ltd., Beijing (CN)

(72) Inventor: Yong Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/770,487

(22) PCT Filed: Apr. 20, 2021

(86) PCT No.: PCT/CN2021/088533
§ 371 (c)(1),
(2) Date: Apr. 20, 2022

(87) PCT Pub. No.: WO2022/222049
PCT Pub. Date: Oct. 27, 2022

(65) Prior Publication Data
US 2024/0147805 A1 May 2, 2024

(51) Int. Cl.
*H10K 59/38* (2023.01)
*H10K 59/12* (2023.01)

(52) U.S. Cl.
CPC ......... *H10K 59/38* (2023.02); *H10K 59/1201* (2023.02)

(58) Field of Classification Search
CPC .. H10K 59/38; H10K 59/1201; H10K 50/115; H01L 33/00
See application file for complete search history.

(56) References Cited

U.S. PATENT DOCUMENTS 10,700,236 B2 * 6/2020 Steckel ............... H01L 27/1225
10,903,393 B2 * 1/2021 Kristal .................. H10K 50/16
(Continued)

FOREIGN PATENT DOCUMENTS

CN 102983230 A 3/2013
CN 103728837 A 4/2014
(Continued)

*Primary Examiner* — Kyoung Lee
*Assistant Examiner* — Sophia W Kao
(74) *Attorney, Agent, or Firm* — ArentFox Schiff LLP; Michael Fainberg

(57) ABSTRACT

Embodiments of the present disclosure provide a quantum dot pattern, a quantum dot light-emitting device, a display apparatus and a manufacturing method. The method includes: forming grooves in one side of an original substrate; forming an isolation layer on the side, with the grooves, of the original substrate; forming quantum dot pattern portions in pattern pits; forming a sacrificial layer on sides, facing away from the isolation layer, of the quantum dot pattern portions; attaching an adhesive layer to a side, facing away from the quantum dot pattern portions, of the sacrificial layer; peeling off the adhesive layer to separate the quantum dot pattern portions and the sacrificial layer from the isolation layer together with the adhesive layer; and enabling a surface, exposing the quantum dot pattern portions, of the laminated structure to be in contact with a target substrate, and removing the sacrificial layer and the adhesive layer.

13 Claims, 8 Drawing Sheets

(56) References Cited

U.S. PATENT DOCUMENTS

| | | | |
|---|---|---|---|
| 10,923,672 B1* | 2/2021 | Li | H10K 59/38 |
| 11,495,764 B2* | 11/2022 | Kim | H10K 50/115 |
| 2013/0056705 A1* | 3/2013 | Kim | G03F 7/0002 |
| | | | 257/15 |
| 2016/0011506 A1 | 1/2016 | Gu et al. | |
| 2017/0045643 A1 | 2/2017 | Cunningham et al. | |
| 2018/0277782 A1* | 9/2018 | Kim | H10K 50/844 |
| 2019/0280152 A1 | 9/2019 | Kristal et al. | |
| 2021/0143233 A1* | 5/2021 | Bok | H01L 31/048 |

FOREIGN PATENT DOCUMENTS

| | | | | |
|---|---|---|---|---|
| CN | 107851684 A | 3/2018 | | |
| CN | 108281092 A | 7/2018 | | |
| CN | 108389785 A | 8/2018 | | |
| CN | 108987613 A | 12/2018 | | |
| CN | 109256455 A | 1/2019 | | |
| CN | 109256456 A | 1/2019 | | |
| CN | 109979960 A | 7/2019 | | |
| CN | 108281092 B * | 12/2019 | | G02B 5/00 |

\* cited by examiner

QUANTUM DOT PATTERN, QUANTUM DOT LIGHT-EMITTING DEVICE, DISPLAY APPARATUS, AND MANUFACTURING METHOD

CROSS REFERENCE TO RELATED APPLICATIONS

The present disclosure is a US National Stage of International Application No. PCT/CN2021/088533, filed on Apr. 20, 2021, the entire contents of which are incorporated herein by reference.

FIELD

The present disclosure relates to the field of semiconductors, in particular to a quantum dot pattern, a quantum dot light-emitting device, a display apparatus and a manufacturing method.

BACKGROUND

Among various new display technologies, quantum dots are known for unique optoelectronic properties, such as high brightness, narrow emission spectrum, wide color gamut tunability, high quantum yield, and good stability. Extensive research has been carried out to realize electro/optical conversion quantum dot light-emitting diodes available for mass production.

SUMMARY

Embodiments of the present disclosure provide a quantum dot pattern, a quantum dot light-emitting device, a display apparatus and a manufacturing method. The manufacturing method includes: forming a plurality of grooves in one side of an original substrate; forming an isolation layer on the side, with the plurality of grooves, of the original substrate, wherein a thickness of the isolation layer is smaller than a depth of the grooves, and pattern pits are formed in a region, corresponding to the grooves, of the isolation layer; forming quantum dot pattern portions in the pattern pits through a quantum dot solution self-assembly process; forming a sacrificial layer on sides, facing away from the isolation layer, of the quantum dot pattern portions; attaching an adhesive layer to a side, facing away from the quantum dot pattern portions, of the sacrificial layer; peeling off the adhesive layer to separate the quantum dot pattern portions and the sacrificial layer from the isolation layer together with the adhesive layer, to obtain a laminated structure of the adhesive layer, the sacrificial layer and the quantum dot pattern portions; and enabling a surface, exposing the quantum dot pattern portions, of the laminated structure to be in contact with a target substrate, and removing the sacrificial layer and the adhesive layer.

In one possible implementation, after the peeling off the adhesive layer and before the enabling the surface, exposing the quantum dot pattern portions, of the laminated structure to be in contact with the target substrate, the manufacturing method further includes: attaching a surface, with the adhesive layer, of the laminated structure to an alignment substrate; and aligning and attaching the alignment substrate to which the laminated structure is attached with the target substrate through a surface with the quantum dot pattern portions.

In one possible implementation, the removing the sacrificial layer and the adhesive layer includes: dissolving the sacrificial layer by immersing the laminated structure in a first solution.

In one possible implementation, the forming the plurality of grooves in one side of the original substrate includes: forming a plurality of grooves with a first ratio ranges from 0.005 to 0.06 in one side of the original substrate, wherein the first ratio is a ratio of the depth of the grooves to a minimum opening size of the grooves in a direction perpendicular to a depth direction.

In one possible implementation, the forming the plurality of grooves with the first ratio ranging from 0.005 to 0.06 in one side of the original substrate includes: forming a plurality of grooves with a depth ranging from 15 nm to 30 nm and a minimum opening size in the direction perpendicular to the depth direction ranging from 500 nm to 3000 nm in one side of the original substrate through a patterning process.

In one possible implementation, the forming the plurality of grooves in one side of the original substrate includes: forming a plurality of grooves with a first ratio ranging from 1.67 to 20 in one side of the original substrate, wherein the first ratio is a ratio of the depth of the grooves to a minimum opening size of the grooves in a direction perpendicular to a depth direction.

In one possible implementation, the forming the plurality of grooves with the first ratio ranging from 1.67 to 20 in one side of the original substrate includes: forming a plurality of grooves with a depth ranging from 5000 nm to 10000 nm and a minimum opening size in the direction perpendicular to the depth direction ranging from 500 nm to 3000 nm in one side of the original substrate.

In one possible implementation, the forming the quantum dot pattern portions in the pattern pits through the quantum dot solution self-assembly process includes: providing a quantum dot solution with a quantum dot concentration ranging from 10 mg/mL to 90 mg/mL and a toluene mass fraction ranging from 10% to 15% in a binary solvent of toluene and heptane; and spin-coating a side, facing away from the original substrate, of the isolation layer with the quantum dot solution, wherein the quantum dot solution is formed at the pattern pits by capillary action.

In one possible implementation, the forming the isolation layer on the side, with the grooves, of the original substrate includes: spin-coating the side, with the grooves, of the original substrate with a polydimethylsiloxane solution; and forming the isolation layer by performing heating treatment for a first period of time to remove a solvent in the polydimethylsiloxane solution.

In one possible implementation, the forming the sacrificial layer on the sides, facing away from the isolation layer, of the quantum dot pattern portions includes: spin-coating the sides, facing away from the isolation layer, of the quantum dot pattern portions with a polymethyl methacrylate solution; and forming the sacrificial layer by performing heating treatment for a second period of time to remove a solvent in the polymethyl methacrylate solution.

In one possible implementation, the attaching the adhesive layer on the side, facing away from the quantum dot pattern portions, of the sacrificial layer includes: attaching a polyimide film layer to the side, facing away from the quantum dot pattern portions, of the sacrificial layer.

In one possible implementation, the forming the plurality of grooves in one side of the original substrate includes: forming the plurality of grooves in one side of the original substrate through a photolithography patterning process.

In one possible implementation, an adhesive force between the sacrificial layer and the quantum dot pattern portions is greater than an adhesive force between the quantum dot pattern portions and the isolation layer.

An embodiment of the present disclosure further provides a quantum dot pattern, including: a plurality of quantum dot pattern portions arranged on one side of a base substrate, wherein a ratio of a thickness of the quantum dot pattern portions to a minimum size of the quantum dot pattern portions in a direction perpendicular to a thickness direction ranges from 0.005 to 0.06, or a ratio of a thickness of the quantum dot pattern portions to a minimum size of the quantum dot pattern portions in a direction perpendicular to a thickness direction ranges from 1.67 to 20.

In one possible implementation, the minimum size of the quantum dot pattern portions in the direction perpendicular to the thickness direction ranges from 500 nm to 3000 nm.

In one possible implementation, the thickness of the quantum dot pattern portions ranges from 15 nm to 30 nm.

In one possible implementation, the thickness of the quantum dot pattern portions ranges from 5000 nm to 10000 nm.

An embodiment of the present disclosure further provides a quantum dot light-emitting device, including: a first base substrate; a first electrode, arranged on one side of the first base substrate; a first functional layer, arranged on a side, facing away from the first base substrate, of the first electrode; a quantum dot light-emitting layer, arranged on a side, facing away from the first electrode, of the first functional layer, and including the plurality of quantum dot pattern portions provided by the embodiment of the present disclosure; a second functional layer, arranged on a side, facing away from the first functional layer, of the quantum dot light-emitting layer; and a second electrode, arranged on a side, facing away from the quantum dot light-emitting layer, of the second functional layer.

An embodiment of the present disclosure further provides a display apparatus, including: a light-emitting substrate; and a light conversion layer, arranged on a light emergence side of the light-emitting substrate, and including the plurality of quantum dot pattern portions provided by the embodiment of the present disclosure.

In one possible implementation, the light-emitting substrate includes: a second base substrate; a driving circuit, arranged on a side, facing the light conversion layer, of the second base substrate; and a backlight source, arranged on a side, facing the light conversion layer, of the driving circuit.

In one possible implementation, the backlight source is a blue light emitting diode, or the backlight source is an organic light-emitting device emitting blue light.

In one possible implementation, the display apparatus includes light blocking structures located between adjacent quantum dot pattern portions.

In one possible implementation, the display apparatus includes: a color film layer arranged on a side, facing away from the light-emitting substrate, of the light conversion layer, wherein the color film layer includes color filter portions in one-to-one correspondence with the quantum dot pattern portions.

In one possible implementation, the display apparatus includes a third base substrate arranged on a side, facing away from the light-emitting substrate, of the color film layer.

In one possible implementation, the display apparatus includes a quarter-wave plate arranged on a side, facing away from the light-emitting substrate, of the third base substrate.

DETAILED DESCRIPTION OF THE EMBODIMENTS

Figure 1:
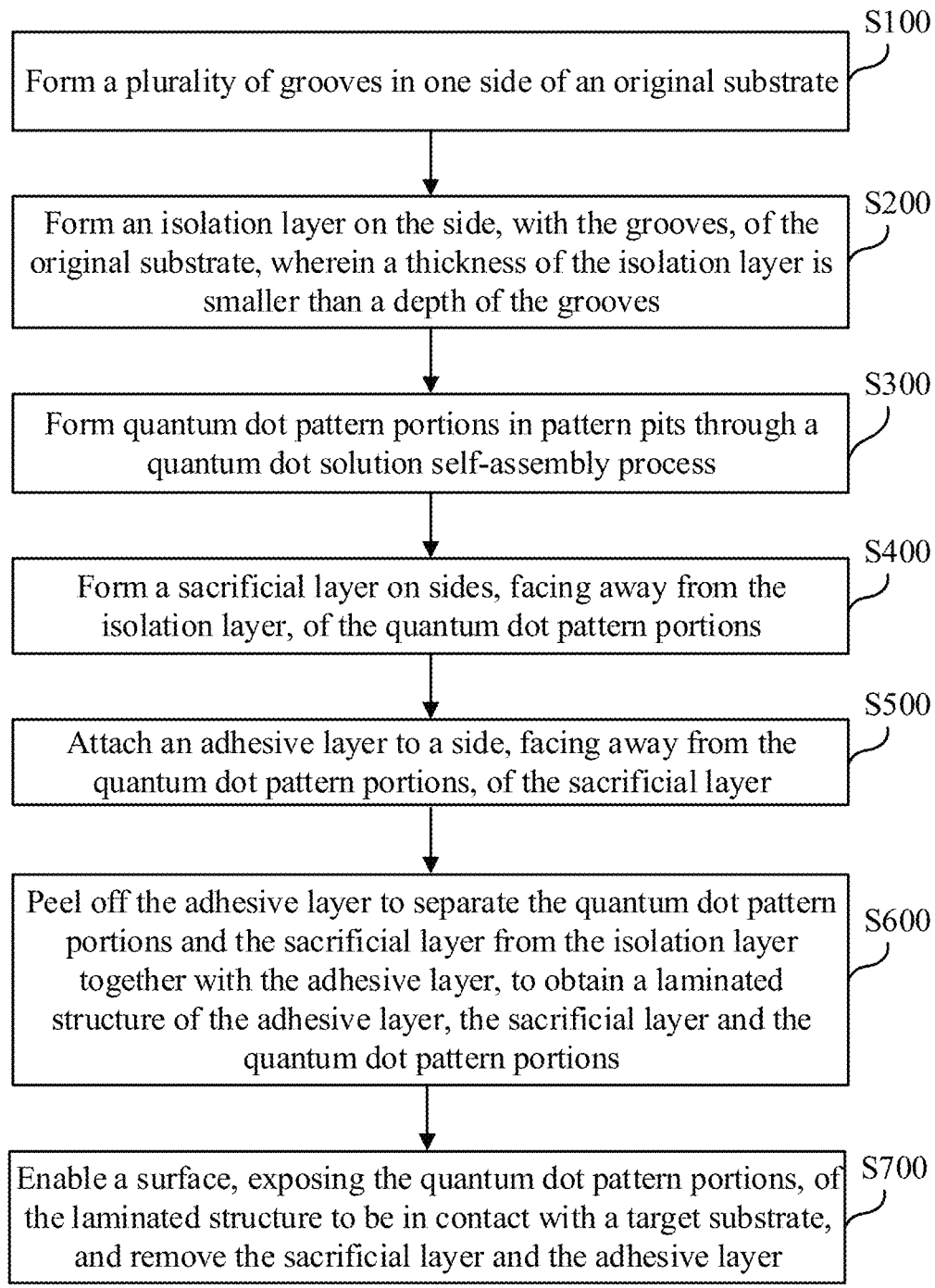
FIG. 1 is one of schematic diagrams of a manufacturing process of a patterned quantum dot film layer according to an embodiment of the present disclosure.

In order to make the objectives, technical solutions, and advantages of embodiments of the present disclosure clearer, the technical solutions of the embodiments of the present disclosure will be described clearly and completely with reference to accompanying drawings of the embodiments of the present disclosure. It is apparent that the described embodiments are part of, rather than all of, embodiments of the present disclosure. Based on the described embodiments of the present disclosure, all other embodiments obtained by those ordinarily skilled in the art without creative labor fall within the protection scope of the present disclosure.

Unless otherwise defined, technical or scientific terms used in the present disclosure shall have ordinary meanings as understood by those with ordinary skills in the art to which the present disclosure belongs. "First", "second" and similar words used in the present disclosure do not indicate any order, quantity or importance, but are only used to distinguish different components. "Comprise" or "include" or other similar words mean that the element or item appearing before the word encompasses the element or item listed after the word and its equivalents, but does not exclude other elements or items. "Connecting" or "connected" or other similar words are not limited to physical or mechanical connections, but may include electrical connections, whether direct or indirect. "Upper", "lower", "left", "right", etc. are only used to indicate a relative position relationship which may change accordingly when the absolute position of an object being described changes.

To keep the following description of the embodiments of the present disclosure clear and concise, the present disclosure omits detailed descriptions of well-known functions and well-known components.

With the continuous development of technology, the performance of red, green, and blue quantum dot devices has been continuously improved, especially their efficiency has been sharply improved, but it is still difficult to pattern red, green, and blue full-color quantum dot arrays. The complexity of patterning quantum dots is mainly due to the colloidal state of synthesized quantum dots. It has been proven that processes such as transfer printing, inkjet printing, and lithography may be used for the patterning of quantum dots to improve the performance of displays. However, with the continuous improvement of people's requirements for quality of life and the demand for various new types of displays, display devices need high performance with a high pixel density and even an ultra-high pixel density. While ensuring the ultra-high pixel density, a high color gamut of luminescent materials must be guaranteed to ensure accurate color expression. Quantum dots have very broad application prospects in the field of ultra-high resolution (pixel density) due to their highly saturated color gamut and transparent properties of quantum dot films. The sub-pixel feature size in current smart phones is in the range of tens of microns, but there are limitations in the patterning of quantum dots in ultra-high-resolution displays, and their micro-nano-sized uniform full-color pixel arrays and high fidelity have major problems. More importantly, the light-emitting properties of quantum dots may deteriorate to a certain extent after patterning, thereby reducing the performance of display.

In view of this, an embodiment of the present disclosure provides a method for manufacturing a patterned quantum dot film layer, as shown in FIG. 1 and FIG. 2 to FIG. 8.

Figure 2:
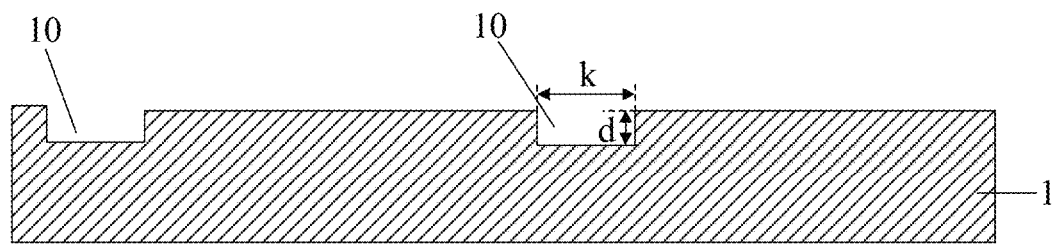
FIG. 2 is a schematic structural diagram of forming grooves in an original substrate according to an embodiment of the present disclosure.

S100, a plurality of grooves 10 are formed in one side of an original substrate 1, as shown in FIG. 2. Specifically, the original substrate 1 may be a silicon substrate. Specifically, the plurality of grooves 10 may be formed by a photolithography patterning process. A shape of an orthographic projection of the grooves 10 on a side, facing away from the grooves 10, of the original substrate 1 may be made according to specific requirements of a pixel pattern. Specifically, for example, the shape of the orthographic projection of the grooves 10 on the side, facing away from the grooves 10, of the original substrate 1 may be a single geometric figure such as a line, a circle, a rectangle, a rhombus, a hexagon, and a pentagon, or a combined shape of the above figures.

Figure 3:
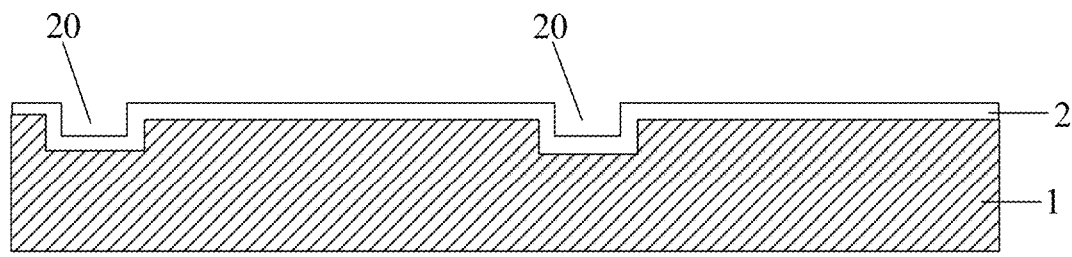
FIG. 3 is a schematic structural diagram of forming an isolation layer according to an embodiment of the present disclosure.

S200, an isolation layer 2 is formed on the side, with the grooves 10, of the original substrate 1. A thickness of the isolation layer 2 is smaller than a depth of the grooves 10. Pattern pits 20 are formed in a region, corresponding to the grooves 10, of the isolation layer 2, as shown in FIG. 3. Specifically, this step may include: the side, with the grooves 10, of the original substrate 1 is spin-coated with a polydimethylsiloxane (PDMS) solution; and heating treatment is performed for a first period of time to remove a solvent in the polydimethylsiloxane solution, so as to form the isolation layer 2. Specifically, the PDMS solution (heptane is used as a solvent solution, and the mass fraction range of PDMS may be 1 wt % to 3 wt %, specifically, 2 wt % for example) may be spin-coated at 3000 rpm for 20 s, and then the heating treatment is performed in a vacuum oven for the first period of time (for example, the first period of time is 30 min). A thickness of the obtained PDMS ranges from 3 nm to 5 nm.

Figure 4:
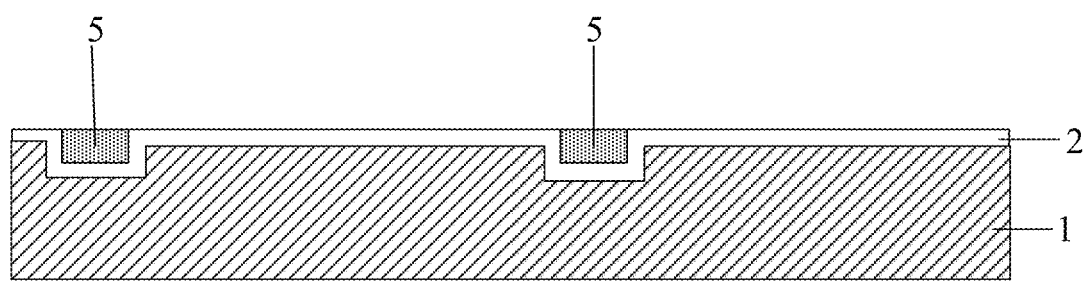
FIG. 4 is a schematic diagram of forming quantum dot pattern portions in pattern pits according to an embodiment of the present disclosure.

S300, quantum dot pattern portions 5 are formed in the pattern pits 20 through a quantum dot solution self-assembly process, as shown in FIG. 4.

Figure 5:
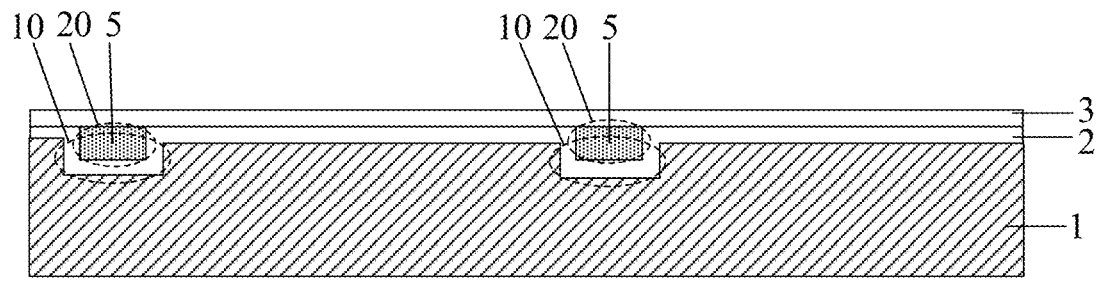
FIG. 5 is a schematic structural diagram of forming a sacrificial layer according to an embodiment of the present disclosure.

In S400, a sacrificial layer 3 is formed on sides, facing away from the isolation layer 2, of the quantum dot pattern portions 5, as shown in FIG. 5. Specifically, an adhesive force between the sacrificial layer 3 and the quantum dot pattern portions 5 is greater than an adhesive force between the quantum dot pattern portions 5 and the isolation layer 2, so that the quantum dot pattern portions 5 may be separated from the isolation layer 2 during subsequent peeling. Specifically, S400 may include: the sides, facing away from the isolation layer 2, of the quantum dot pattern portions 5 are spin-coated with a polymethyl methacrylate (PMMA) solution; and heating treatment is performed for a second period of time to remove a solvent in the polymethyl methacrylate solution to form the sacrificial layer 3. Specifically, the PMMA solution (acetone is used as the solvent, and the mass fraction range of PMMA may be 1 wt % to 3 wt %, specifically, 2 wt % for example) may be spin-coated at 3000 rpm for 10 s to form a PMMA film layer as the sacrificial layer 3.

Figure 6:
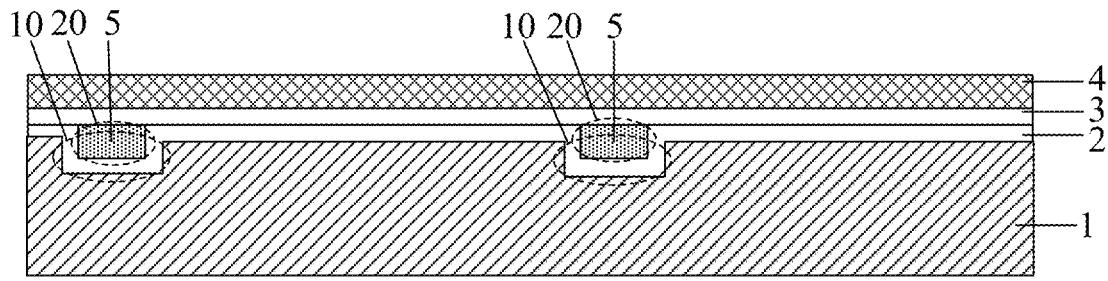
FIG. 6 is a schematic structural diagram of forming an adhesive layer according to an embodiment of the present disclosure.

S500, an adhesive layer 4 is attached to a side, facing away from the quantum dot pattern portions 5, of the sacrificial layer 3, as shown in FIG. 6. Specifically, this step may include: a polyimide film (PI film) layer is attached to the side, facing away from the quantum dot pattern portions 5, of the sacrificial layer 3.

Figure 7:
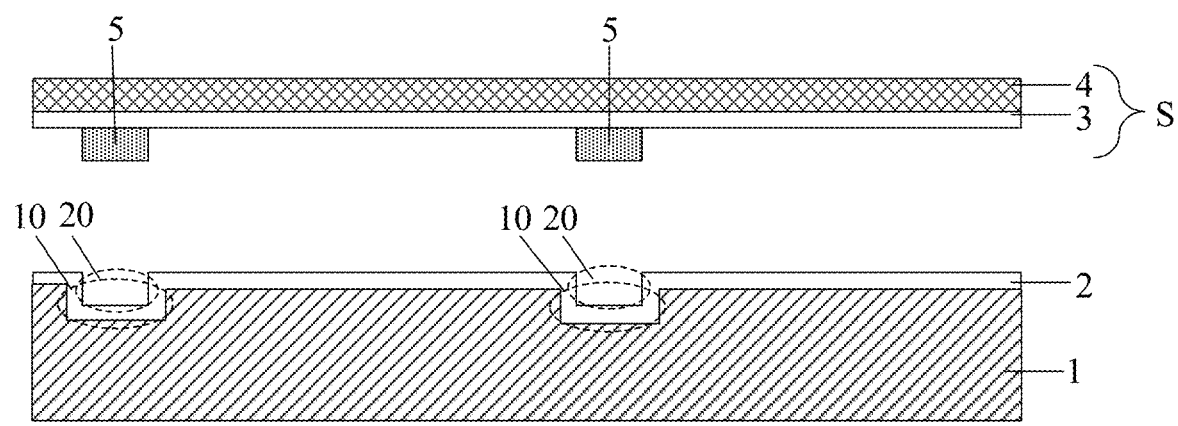
FIG. 7 is a schematic structural diagram of separating quantum dot pattern portions from an isolation layer according to an embodiment of the present disclosure.

S600, the adhesive layer 4 is peeled off so that the quantum dot pattern portions 5 and the sacrificial layer 3 may be separated from the isolation layer 2 together with the adhesive layer 4, so as to obtain a laminated structure S of the adhesive layer 4, the sacrificial layer 3 and the quantum dot pattern portions 5, as shown in FIG. 7. The adhesive layer 4 (the PI film layer) may drive the sacrificial layer 3 (a PMMA film layer) and the quantum dot pattern portions 5 to separate from the isolation layer 2 (a PDMS film layer) due to adhesion.

Figure 8:
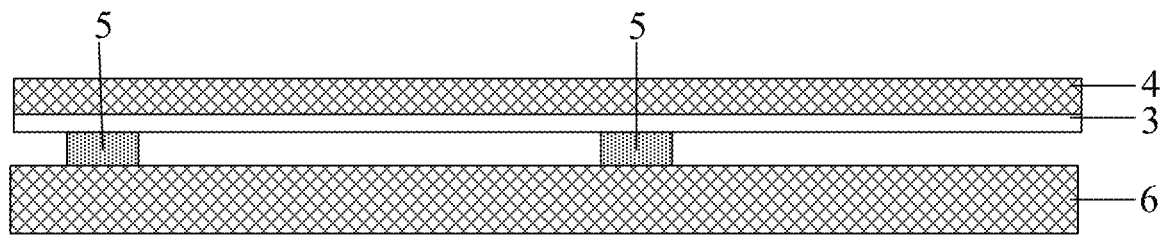
FIG. 8 is a schematic diagram of transferring quantum dot pattern portions to a target substrate according to an embodiment of the present disclosure.

S700, a surface, exposing the quantum dot pattern portions 5, of the laminated structure S is in contact with a target substrate 6, as shown in FIG. 8, and the sacrificial layer 3 and the adhesive layer 4 are removed.

In the embodiment of the present disclosure, by first forming the grooves in the original substrate, forming the isolation layer on the side, with the grooves, of the original substrate, and forming the quantum dot pattern portions in the pattern pits through the solution self-assembly process, a micro-nano-sized array of quantum dots is manufactured. Subsequently, the sacrificial layer is formed on the sides, facing away from the isolation layer, of the quantum dot pattern portions, the adhesive layer is attached to the side, facing away from the quantum dot pattern portions, of the sacrificial layer, the quantum dot pattern portions may be separated from the isolation layer by peeling off the adhesive layer, and then combined with a transfer process, manufacturing of the quantum dot film layer in an ultra-high pixel density array is realized. The quantum dot film layer has better patterning yield and repeatability, and meets technical requirements of mass production, at the same time, original optical properties of quantum dots are retained, and the performance of a display device is guaranteed.

Figure 9:
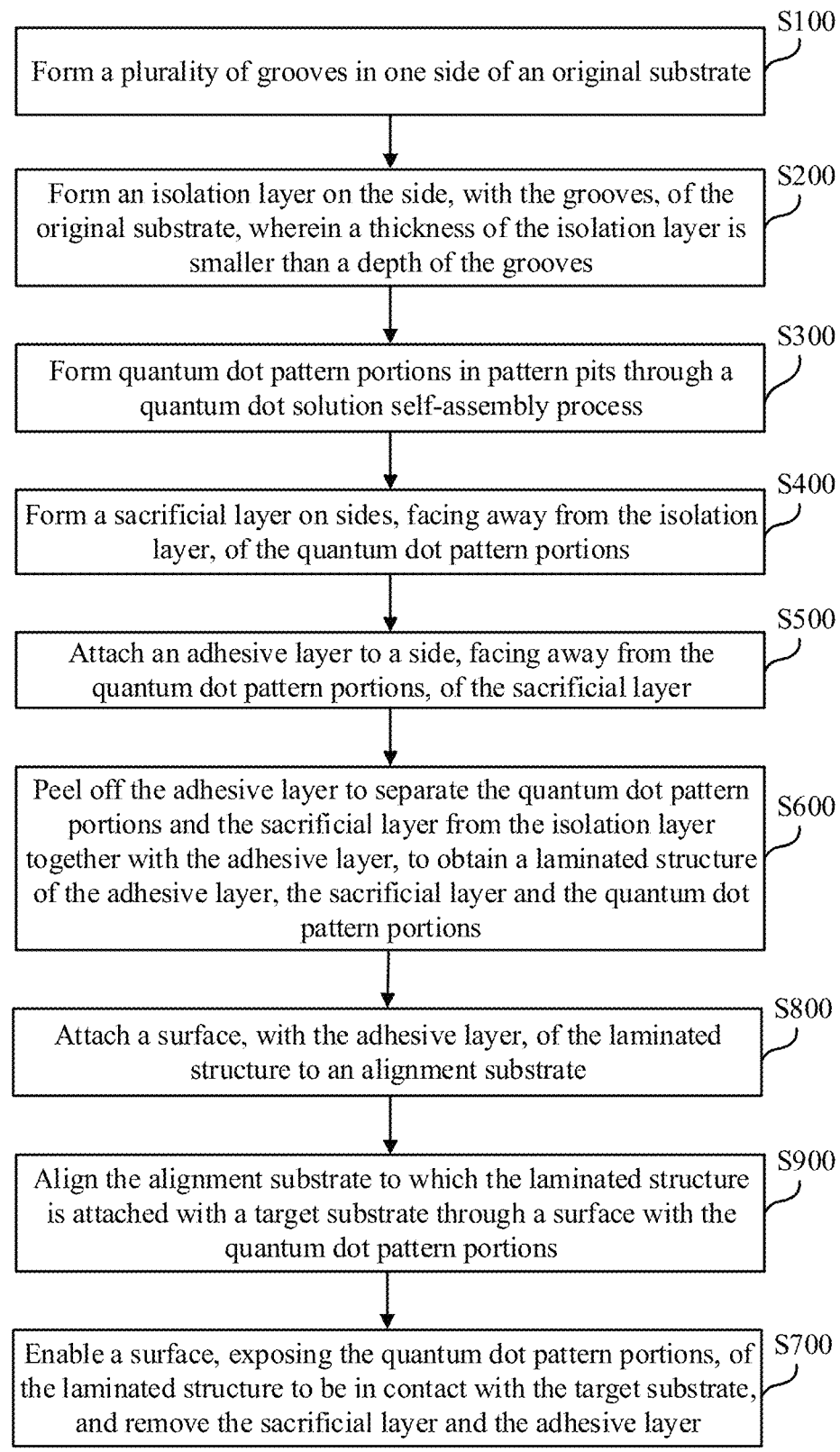
FIG. 9 is a second schematic diagram of a manufacturing process of a patterned quantum dot film layer according to an embodiment of the present disclosure.
Figure 10:
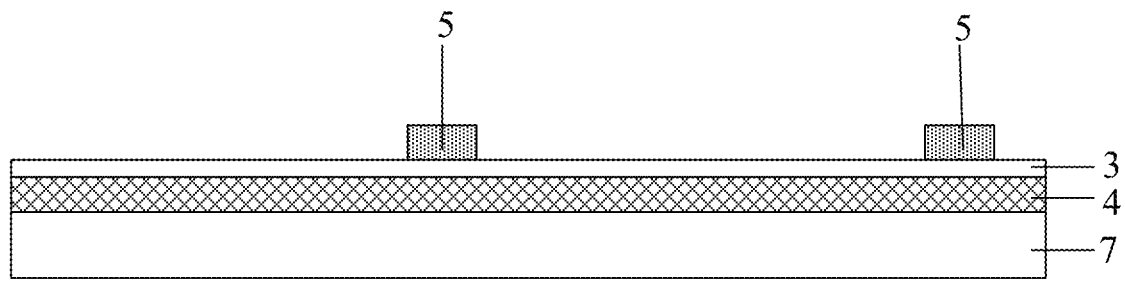
FIG. 10 is a schematic diagram of transferring quantum dot pattern portions to a transfer substrate according to an embodiment of the present disclosure.
Figure 11:
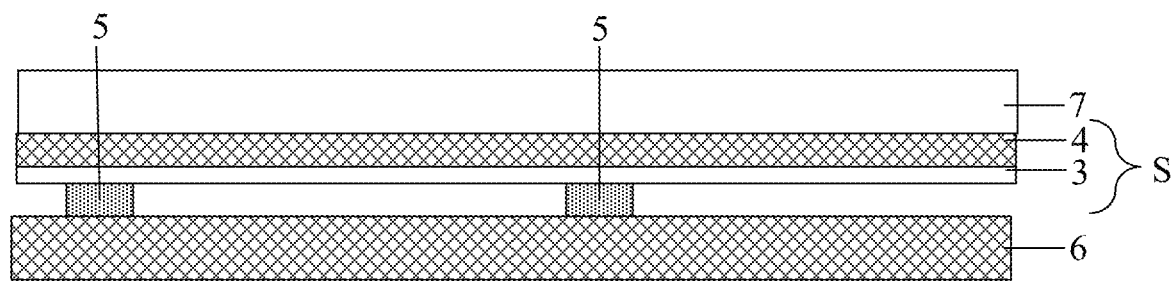
FIG. 11 is a schematic diagram of aligning and attaching a transfer substrate and a target substrate according to an embodiment of the present disclosure.

In one possible implementation, as shown in FIG. 9, FIG. 10 and FIG. 11, after S600 and before S700, that is, after the adhesive layer is peeled off, and before the surface, exposing the quantum dot pattern portions, of the laminated structure is in contact with the target substrate, the manufacturing method further includes the following steps.

S800, a surface, with the adhesive layer 4, of the laminated structure S is attached to an alignment substrate 7, as shown in FIG. 10. Specifically, the alignment substrate 7 may have a first alignment mark, and the target substrate 6 may have a corresponding second alignment mark. By aligning the first alignment mark of the alignment substrate 7 with the second alignment mark of the target substrate 6, the quantum dot pattern portions 5 may be accurately transferred to the target substrate 6. Specifically, the alignment substrate 7 may be a glass substrate.

S900, the alignment substrate 7 to which the laminated structure S is attached is aligned with the target substrate 6 through a surface with the quantum dot pattern portions 5, as shown in FIG. 11.

In the embodiment of the present disclosure, before the quantum dot pattern portions 5 are transferred to the target substrate 6, the side, with the adhesive layer 4, of the laminated structure S may be attached to the alignment substrate 7 first, and the quantum dot pattern portions 5 may be accurately transferred to the target substrate 6 by aligning the alignment substrate 7 with the target substrate 6.

It can be understood that, the above steps S100-S700 may realize formation of quantum dot pattern portions with one light emergence color, and when quantum dot pattern portions with various light emergence colors need to be formed, quantum dot pattern portions with various light emergence colors may be manufactured by repeating the steps S100-S700 many times.

In one possible implementation, as shown in FIG. 11, step S700, that is, the sacrificial layer 3 and the adhesive layer 4 are removed, may include: the laminated structure S is immersed in a first solution to dissolve the sacrificial layer 3. Specifically, the first solution may be an acetone solution.

This step may include: the laminated structure S is immersed in the acetone solution (the first solution) for 30 min to dissolve the sacrificial layer 3 (the PMMA film layer), other film layer structures (for example, the adhesive layer 4 and the alignment substrate 7) on the side, facing away from the quantum dot pattern portions 5, of the sacrificial layer 3 (the PMMA film layer) are separated from the quantum dot pattern portions 5, and the quantum dot pattern portions 5 remain on the target substrate 6, completing the transfer process of the quantum dot pattern portions 5 from the original substrate 1 to the target substrate 6.

Figure 12:
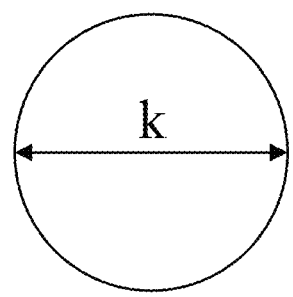
FIG. 12 is a schematic diagram of a quantum dot pattern portion when projected as a circle according to an embodiment of the present disclosure.
Figure 13:
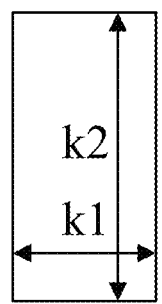
FIG. 13 is a schematic diagram of a quantum dot pattern portion when projected as a rectangle according to an embodiment of the present disclosure.
Figure 14:
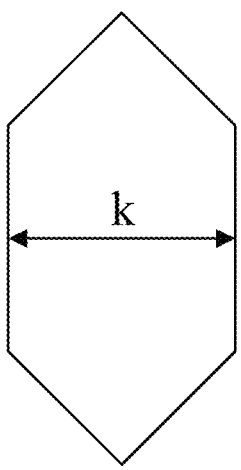
FIG. 14 is a schematic diagram of a quantum dot pattern portion when projected as a hexagon according to an embodiment of the present disclosure.

In one possible implementation, in conjunction with FIG. 2, step S100, that is, the plurality of grooves 10 are formed in one side of the original substrate 1, includes: a plurality of grooves 10 with a first ratio of 0.005-0.06 are formed in one side of the original substrate 1. The first ratio is a ratio of the depth d of the grooves 10 to a minimum opening size k of the grooves in a direction perpendicular to a depth direction. Specifically, for example, as shown in FIG. 12, when the shape of the orthographic projection of the grooves 10 on the surface, facing away from the grooves 10, of the original substrate 1 is a circle, the minimum opening size k of the grooves 10 in the direction perpendicular to the depth direction may be the same as a diameter of the circle. Specifically, when the shape of the orthographic projection of the grooves 10 on the surface, facing away from the grooves 10, of the original substrate 1 is a polygon, the minimum opening size k of the grooves 10 in the direction perpendicular to the depth direction may be understood as a minimum value of distances between two opposite sides of the outline of the orthographic projection of the grooves 10 on the surface, facing away from the grooves 10, of the original substrate 1. For example, as shown in FIG. 13, when the outline of the orthographic projection of the grooves 10 on the surface, facing away from the grooves 10, of the original substrate 1 is a rectangle, there may be a distance k1 of the two opposite long sides and a distance k2 of the two opposite short sides, k1<k2, and the minimum opening size of the grooves in the direction perpendicular to the depth direction may be the smaller distance of the two distances, that is, the distance k1 between the two opposite long sides. For another example, as shown in FIG. 14, when the shape of the orthographic projection of the grooves 10 on the surface, facing away from the grooves 10, of the original substrate 1 is a hexagon, the minimum opening size of the grooves 10 in the direction perpendicular to the depth direction may be the smallest distance among distances between two opposite sides of the hexagon.

Specifically, forming the plurality of grooves 10 with the first ratio of 0.005 to 0.06 in one side of the original substrate 1 includes: a plurality of grooves 10 with a depth being 15 nm to 30 nm and a minimum opening size in the direction perpendicular to the depth direction being 500 nm to 3000 nm are formed in one side of the original substrate 1 through the patterning process. In the embodiment of the present disclosure, since the depth of the grooves 10 is 15 nm to 30 nm, the formed quantum dot pattern portions 5 may be thin, and may be used to manufacture a light-emitting layer in a quantum dot light-emitting device. The thin quantum dot pattern portions 5 may have high electroluminescence efficiency. Moreover, since the minimum opening size of the grooves 10 is 500 nm to 3000 nm, compared with the prior art that a size of sub-pixels is several tens of microns, the embodiment of the present disclosure may form sub-pixels of a small size, which may achieve ultra-high-resolution display. It can be understood that the thickness of the quantum dot pattern portions 5 may be approximately the same as the depth of the grooves 10.

Specifically, the forming the plurality of grooves 10 in one side of the original substrate 1 includes: a plurality of grooves 10 with a first ratio of 1.67-20 being formed in one side of the original substrate 1. The first ratio is a ratio of the depth of the grooves 10 to a minimum opening size of the grooves in the direction perpendicular to the depth direction.

Specifically, forming the plurality of grooves with the first ratio of 1.67-20 in one side of the original substrate includes: a plurality of grooves 10 with a depth being 5000 nm to 10000 nm and a minimum opening size in the direction perpendicular to the depth direction being 500 nm to 3000 nm are formed in one side of the original substrate 1. In the embodiment of the present disclosure, since the depth of the grooves 10 ranges from 5000 nm to 10000 nm, the formed quantum dot pattern portions 5 may be thick, and may be used to manufacture a light conversion layer in a display apparatus. The thick quantum dot pattern portions 5 may have high electroluminescence efficiency. Moreover, since the minimum opening size of the grooves 10 is 500 nm to 3000 nm, compared with the prior art that a size of sub-pixels is several tens of microns, the embodiment of the present disclosure may form sub-pixels of a small size, which may achieve ultra-high-resolution display.

In one possible implementation, step S300, that is, the quantum dot pattern portions are formed in the pattern pits through the quantum dot solution self-assembly process, includes: a quantum dot solution with a quantum dot concentration of 10 mg/mL to 90 mg/mL and a toluene mass fraction of 10% to 15% in a binary solvent of toluene and heptane is provided. The quantum dot solution may be spin-coated at 1000-3000 rpm for 10 s to 30 s, where the quantum dot solution may include quantum dot and the binary solvent composed of toluene and heptane. The toluene mass fraction is 0 to 100%, specifically, 0-30%, and more specifically, 10%-15%. The quantum dot concentration may be 0-100 mg/mL, specifically, 10-90 mg/mL.

A side, facing away from the original substrate, of the isolation layer is spin-coated with the quantum dot solution, and the quantum dot solution is formed at the pattern pits by capillary action.

In the embodiment of the present disclosure, by providing the quantum dot solution with the quantum dot concentration of 10 mg/mL to 90 mg/mL and a solvent mass fraction of 10% to 15%, the quantum dot solution may be formed at the pattern pits by capillary action when the side, facing away from the original substrate, of the isolation layer is spin-coated with the quantum dot solution, such that formation of quantum dot pattern portions of an ultra-high-resolution display device is achieved.

Figure 15A:
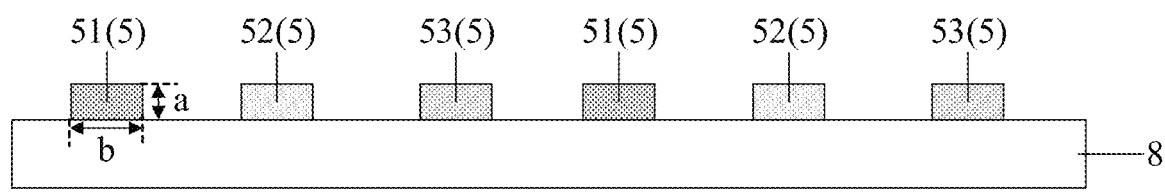
FIG. 15A is a schematic structural diagram of a quantum dot pattern according to an embodiment of the present disclosure.

Based on the same inventive concept, an embodiment of the present disclosure further provides a quantum dot pattern. As shown in FIG. 15A, the quantum dot pattern includes: a plurality of quantum dot pattern portions 5 located on one side of a base substrate 8. A ratio of a thickness a of the quantum dot pattern portions 5 to a minimum size b of the quantum dot pattern portions 5 in a direction perpendicular to a thickness direction is 0.005-0.06, or the ratio of the thickness a of the quantum dot pattern portions 5 to the minimum size b of the quantum dot pattern portions 5 in the direction perpendicular to the thickness direction is 1.67-20. In the embodiment of the present disclosure, as the ratio of the thickness a of the quantum dot pattern portions 5 to the minimum size b of the quantum dot pattern portions 5 in the direction perpendicular to the thickness direction is 0.005-0.06, or the ratio of the thickness a of the quantum dot pattern portions 5 to the minimum size b of the quantum dot pattern portions 5 in the direction perpendicular to the thickness direction is 1.67 to 20, ultra-high-resolution display may be achieved.

Specifically, the ratio of the thickness a of the quantum dot pattern portions 5 to the minimum size b of the quantum dot pattern portions 5 in the direction perpendicular to the thickness direction may be approximately the same as a first ratio related to grooves 10 when the quantum dot pattern portions 5 are formed. Specifically, the quantum dot pattern portions 5 may include first quantum dot pattern portions 51 for emitting red light, second quantum dot pattern portions 52 for emitting green light, and third quantum dot pattern portions 53 for emitting blue light.

In one possible implementation, the minimum size b of the quantum dot pattern portions 5 in the direction perpendicular to the thickness direction ranges from 500 nm to 3000 nm. In the embodiment of the present disclosure, since the minimum size b of the quantum dot pattern portions 5 in the direction perpendicular to the thickness direction ranges from 500 nm to 3000 nm, ultra-high-resolution display may be achieved.

In one possible implementation, the thickness a of the quantum dot pattern portions 5 is nm to 30 nm. In the embodiment of the present disclosure, since the thickness a of the quantum dot pattern portions 5 is 15 nm to 30 nm, the formed quantum dot pattern portions 5 may be thin, and may be used to manufacture a light-emitting layer in a quantum dot light-emitting device. The thin quantum dot pattern portions 5 may have high electroluminescence efficiency.

In one possible implementation, the thickness a of the quantum dot pattern portions 5 is 5000 nm to 10000 nm. In the embodiment of the present disclosure, since the thickness a of the quantum dot pattern portions 5 is 5000 nm to 10000 nm, the formed quantum dot pattern portions 5 may be thick, and may be used to manufacture a light conversion layer in a display apparatus. The thick quantum dot pattern portions 5 may have high electroluminescence efficiency.

Figure 15B:
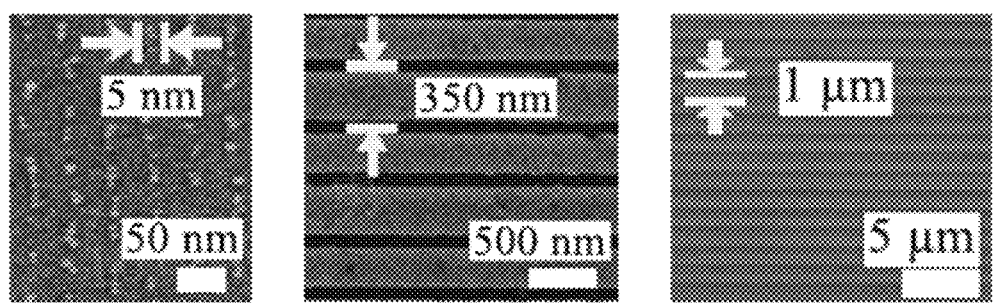
FIG. 15B is a schematic diagram of quantum dot pattern portions of different sizes according to an embodiment of the present disclosure.

FIG. 15B shows arrays of quantum dot pattern portions with various sizes from 5 nm to 1 μm formed by a quantum dot pattern manufacturing method provided by the embodiment of the present disclosure, from which it may be seen that with the reduction of the size of the quantum dot pattern portions, the saturation of the transferred arrays of the quantum dot pattern portions also decreases slightly. In FIG. 15B, the edge error of quantum dot pattern portions with a size of 350 nm is less than 10 nm, which is within an acceptable error range.

Figure 15C:
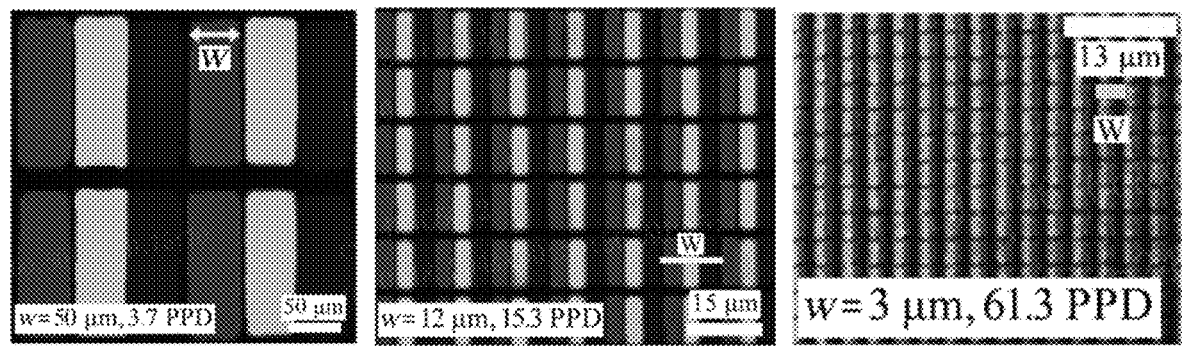
FIG. 15C is a schematic diagram of quantum dot pattern portions with different pixel densities according to an embodiment of the present disclosure.

FIG. 15C shows quantum dot pattern portion arrays of different pixel densities. Red, green and blue quantum dot pattern portion arrays with an ultra-high pixel density are prepared by using solution self-assembly and alignment technology.

Figure 16A:
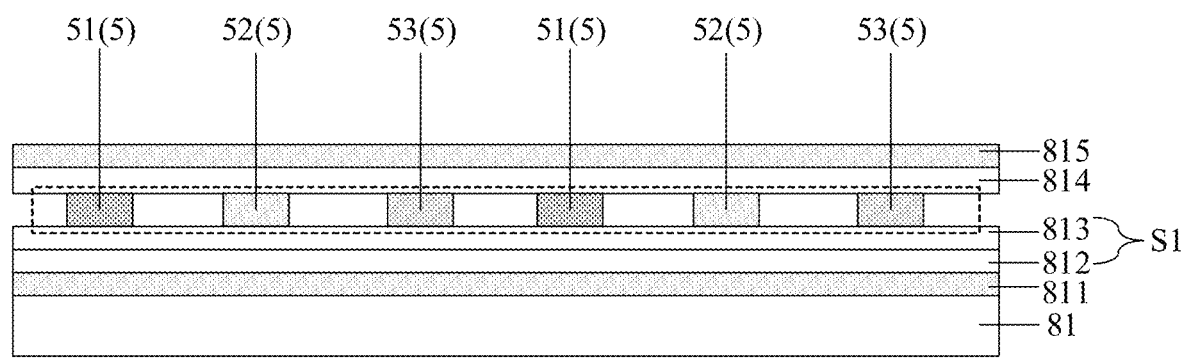
FIG. 16A is a schematic diagram of a quantum dot light-emitting device according to an embodiment of the present disclosure.

Based on the same inventive concept, as shown in FIG. 16A, an embodiment of the present disclosure further provides a quantum dot light-emitting device, including: a first base substrate 81; a first electrode 811, located on one side of the first base substrate 81; a first functional layer S1, located on a side, facing away from the first base substrate 81, of the first electrode 811, where the first functional layer S1 may specifically include a first sub-functional layer 812, and a second sub-functional layer 813 located on a side, facing away from the first electrode 811, of the first sub-functional layer 812; a quantum dot light-emitting layer, located on a side, facing away from the first electrode 811, of the first functional layer S1, and including a plurality of quantum dot pattern portions 5 provided by the embodiment of the present disclosure; a second functional layer 814, located on a side, facing away from the first functional layer S1, of the quantum dot light-emitting layer; and a second electrode 815, located on a side, facing away from the quantum dot light-emitting layer, of the second functional layer 814.

Specifically, taking the quantum dot light-emitting device as an upright structure as an example, the first electrode 811 may be an anode, and a specific material may be indium tin oxide. The first sub-functional layer 812 may specifically be a hole injection layer, a specific material may be PEDOT: PSS, and a film layer thickness may be 25 nm to 30 nm, and specifically, may be 28 nm. The second sub-functional layer 813 may specifically be a hole transport layer, a specific material may be TFB, and a film layer thickness may be 20 nm to 30 nm, and specifically, may be 25 nm. The second functional layer 814 may specifically be an electron transport layer, a specific material may be zinc oxide, and a film layer thickness may be nm to 60 nm, and specifically, may be 50 nm. The second electrode 815 may specifically be a cathode, a specific material may be aluminum, and a film layer thickness may be 80 nm to 120 nm, and specifically, may be 100 nm.

Figure 16B:
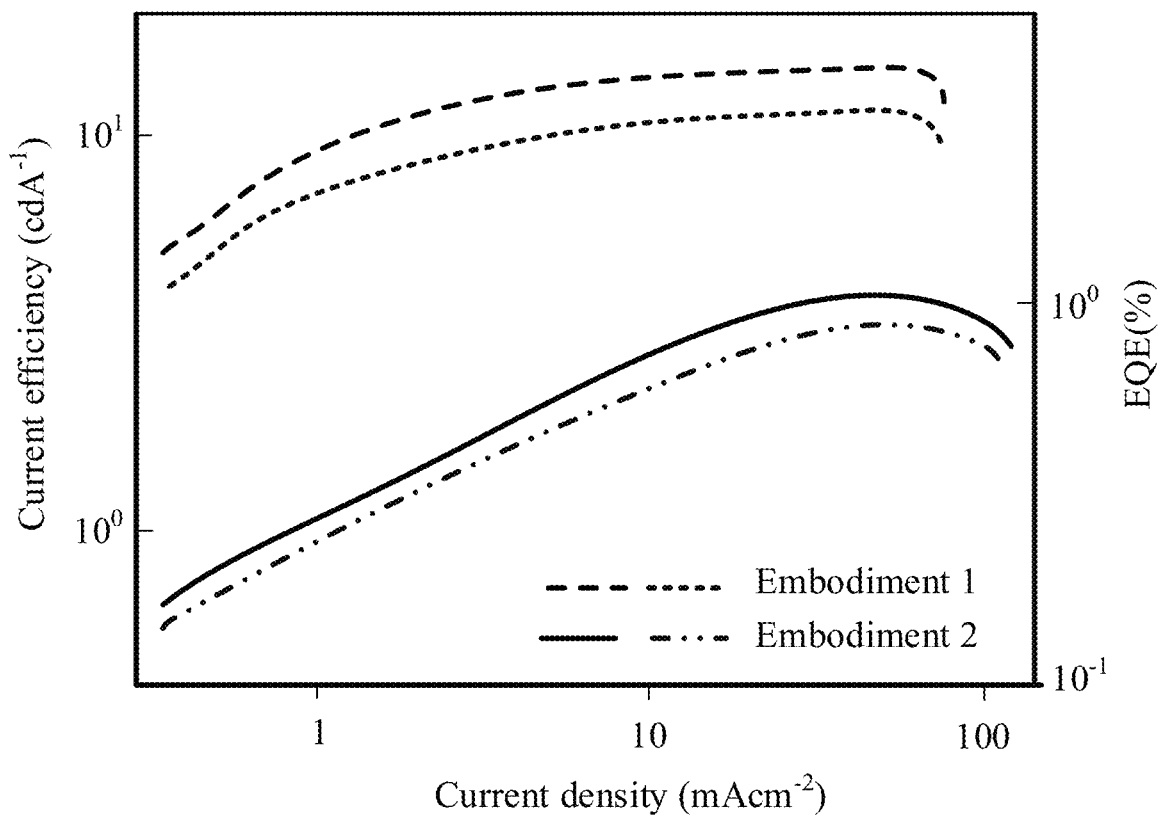
FIG. 16B is a schematic diagram of performance comparison between a quantum dot light-emitting device according to an embodiment of the present disclosure and a conventional quantum dot light-emitting device.

Table 1 and FIG. 16B show comparison of the quantum dot light-emitting device formed by the quantum dot pattern portions prepared by the embodiment of the present disclosure and a quantum dot device prepared by a traditional mature spin-coating process. Embodiment 1 represents the quantum dot light-emitting device formed by the quantum dot pattern portions prepared by the embodiment of the present disclosure. Embodiment 2 represents the quantum dot device prepared by the traditional mature spin-coating process. The performance of the two is equivalent, but red, green, blue sub-pixel densities that may be prepared by the embodiment of the present disclosure are much higher than those of the traditional process, so the embodiment of the present disclosure has broader application prospects.

TABLE 1

|             | V      | CE cd/A | EQE  |
|-------------|--------|---------|------|
| Embodiment 1 | 2.20 V | 14.8    | 3.3% |
| Embodiment 2 | 2.25 V | 15.1    | 3.4% |

Figure 17:
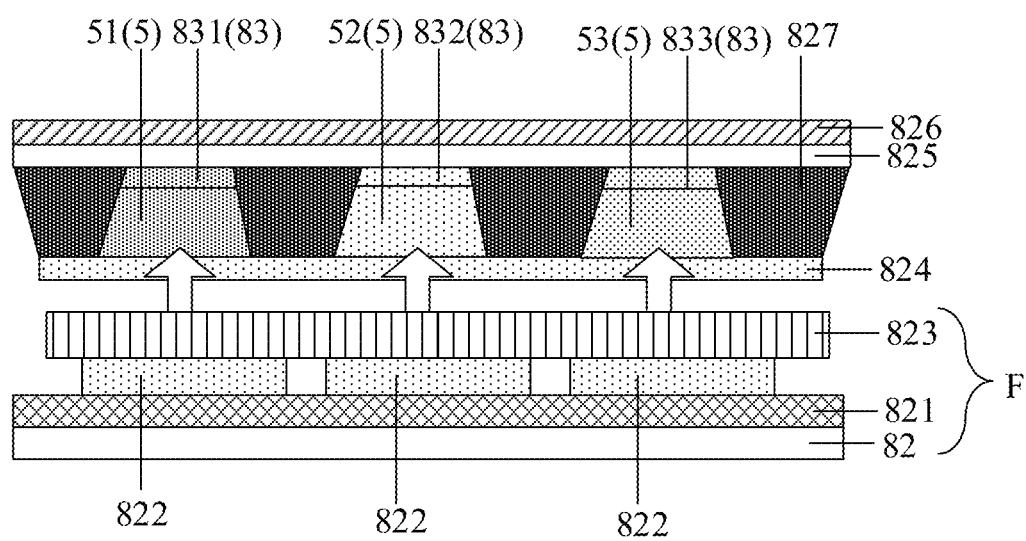
FIG. 17 is a schematic diagram of a display apparatus according to an embodiment of the present disclosure.

Based on the same inventive concept, as shown in FIG. 17, an embodiment of the present disclosure further provides a display apparatus, including: a light-emitting substrate F; and a light conversion layer, located on a light emergence side of the light-emitting substrate F, and including a plurality of quantum dot pattern portions 5 provided by the embodiment of the present disclosure.

In one possible implementation, the light-emitting substrate F includes: a second base substrate 82; a driving circuit, located on a side, facing the light conversion layer, of the second base substrate 82, where the driving circuit may specifically include a driving circuit layer 821, and an electrode layer 822 located on a side, facing away from the second base substrate 82, of the driving circuit layer 821; and a backlight source 823, located on a side, facing the light conversion layer, of the driving circuit.

In one possible implementation, the backlight source 823 may be a blue light emitting diode, or the backlight source 823 may also be an organic light-emitting device emitting blue light.

In one possible implementation, the display apparatus includes light blocking structures 827 located between adjacent quantum dot pattern portions 5.

In one possible implementation, the display apparatus includes: a color film layer located on a side, facing away from the light-emitting substrate, of the light conversion layer. The color film layer includes color filter portions 83 in one-to-one correspondence with the quantum dot pattern portions. Specifically, the color filter portions 83 may include first color filter portions 831 corresponding to first quantum dot pattern portions 51 emitting red light to filter light other than red light, second color filter portions 832 corresponding to second quantum dot pattern portions 52 emitting green light to filter light other than green light, and third color filter portions 833 corresponding to third quantum dot pattern portions 53 emitting blue light to filter light other than blue light.

In one possible implementation, the display apparatus includes a third base substrate 825 located on a side, facing away from the light-emitting substrate, of the color film layer.

In one possible implementation, the display apparatus includes a quarter-wave plate 826 located on a side, facing away from the light-emitting substrate, of the third base substrate 825.

In one possible implementation, the display apparatus includes a quantum dot encapsulation layer 824 located on a side, facing the light-emitting substrate, of the light conversion layer.

In the embodiment of the present disclosure, by first forming the grooves in the original substrate, forming the isolation layer on the surface, with the grooves, of the original substrate, and forming the quantum dot pattern portions in the pattern pits through the solution self-assembly process, a micro-nano-sized array of quantum dots is manufactured. Subsequently, the sacrificial layer is formed on the side, facing away from the isolation layer, of the quantum dot pattern portions, the adhesive layer is attached to the side, facing away from the quantum dot pattern portions, of the sacrificial layer, the quantum dot pattern portions may be separated from the isolation layer by peeling off the adhesive layer, and then combined with a transfer process, manufacturing of the quantum dot film layer in an ultra-high pixel density array is realized. The quantum dot film layer has better patterning yield and repeatability, and meets technical requirements of mass production, at the same time, original optical properties of the quantum dots are retained, and the performance of a display device is guaranteed.

Although preferred embodiments of the present disclosure have been described, those skilled in the art, once armed with basic inventive concepts, can make additional alterations and modifications to these embodiments. Therefore, it is intended that appended claims be interpreted as including the preferred embodiments and all alterations and modifications that fall within the scope of the present disclosure.

It will be apparent to those skilled in the art that various modifications and variations can be made to the embodiments of the present disclosure without departing from the spirit or scope of the embodiments of the present disclosure. Thus, it is intended that the present disclosure cover these modifications and variations of the embodiments of the present disclosure provided they come within the scope of the appended claims of the present disclosure and their equivalents.

What is claimed is:

1. A method for manufacturing a patterned quantum dot film layer, comprising:
   forming a plurality of grooves in one side of an original substrate;
   forming an isolation layer on the side, with the plurality of grooves, of the original substrate, wherein a thickness of the isolation layer is smaller than a depth of the grooves, and pattern pits are formed in a region, corresponding to the grooves, of the isolation layer;
   forming quantum dot pattern portions in the pattern pits through a quantum dot solution self-assembly process;
   forming a sacrificial layer on sides, facing away from the isolation layer, of the quantum dot pattern portions;
   attaching an adhesive layer to a side, facing away from the quantum dot pattern portions, of the sacrificial layer;
   peeling off the adhesive layer to separate the quantum dot pattern portions and the sacrificial layer from the isolation layer together with the adhesive layer, to obtain a laminated structure of the adhesive layer, the sacrificial layer and the quantum dot pattern portions; and
   enabling a surface, exposing the quantum dot pattern portions, of the laminated structure to be in contact with a target substrate, and removing the sacrificial layer and the adhesive layer.

2. The method according to claim 1, wherein after the peeling off the adhesive layer and before the enabling the surface, exposing the quantum dot pattern portions, of the laminated structure to be in contact with the target substrate, the method further comprises:
   attaching a surface, with the adhesive layer, of the laminated structure to an alignment substrate; and
   aligning the alignment substrate to which the laminated structure is attached with the target substrate through a surface with the quantum dot pattern portions.

3. The method according to claim 1, wherein the removing the sacrificial layer and the adhesive layer comprises:
   dissolving the sacrificial layer by immersing the laminated structure in a first solution.

4. The method according to claim 3, wherein the forming the plurality of grooves in one side of the original substrate comprises:
   forming the plurality of grooves with a first ratio ranging from 0.005 to 0.06 in one side of the original substrate, wherein the first ratio is a ratio of the depth of the grooves to a minimum opening size of the grooves in a direction perpendicular to a depth direction.

5. The method according to claim 4, wherein the forming the plurality of grooves with the first ratio ranging from 0.005 to 0.06 in one side of the original substrate comprises:
   forming the plurality of grooves with a depth ranging from 15 nm to 30 nm and a minimum opening size in the direction perpendicular to the depth direction ranging from 500 nm to 3000 nm in one side of the original substrate through a patterning process.

6. The method according to claim 3, wherein the forming the plurality of grooves in one side of the original substrate comprises:
   forming the plurality of grooves with a first ratio ranging from 1.67 to 20 in one side of the original substrate, wherein the first ratio is a ratio of the depth of the grooves to a minimum opening size of the grooves in a direction perpendicular to a depth direction.

7. The method according to claim 6, wherein the forming the plurality of grooves with the first ratio ranging from 1.67 to 20 in one side of the original substrate comprises:
   forming the plurality of grooves with a depth ranging from 5000 nm to 10000 nm and a minimum opening size in the direction perpendicular to the depth direction ranging from 500 nm to 3000 nm in one side of the original substrate.

8. The method according to claim 1, wherein the forming the quantum dot pattern portions in the pattern pits through the quantum dot solution self-assembly process comprises:
   providing a quantum dot solution with a quantum dot concentration ranging from 10 mg/mL to 90 mg/mL and a toluene mass fraction ranging from 10% to 15% in a binary solvent of toluene and heptane; and
   spin-coating a side, facing away from the original substrate, of the isolation layer with the quantum dot solution, wherein the quantum dot solution is formed at the pattern pits by capillary action.

9. The method according to claim 1, wherein the forming the isolation layer on the side, with the grooves, of the original substrate comprises:
   spin-coating the side, with the grooves, of the original substrate with a polydimethylsiloxane solution; and
   forming the isolation layer by performing heating treatment for a first period of time to remove a solvent in the polydimethylsiloxane solution.

10. The method according to claim 9, wherein the forming the sacrificial layer on the sides, facing away from the isolation layer, of the quantum dot pattern portions comprises:
    spin-coating the sides, facing away from the isolation layer, of the quantum dot pattern portions with a polymethyl methacrylate solution; and
    forming the sacrificial layer by performing heating treatment for a second period of time to remove a solvent in the polymethyl methacrylate solution.

11. The method according to claim 10, wherein the attaching the adhesive layer on the sides, facing away from the quantum dot pattern portions, of the sacrificial layer comprises:
    attaching a polyimide film layer to the side, facing away from the quantum dot pattern portions, of the sacrificial layer.

12. The method according to claim 1, wherein the forming the plurality of grooves in one side of the original substrate comprises:
    forming the plurality of grooves in one side of the original substrate through a photolithography patterning process.

13. The method according to claim 1, wherein an adhesive force between the sacrificial layer and the quantum dot pattern portions is greater than an adhesive force between the quantum dot pattern portions and the isolation layer.

* * * * *